United States Patent [19]
Tsang

[11] 4,136,349
[45] Jan. 23, 1979

[54] IC CHIP WITH BURIED ZENER DIODE

[75] Inventor: Wei K. Tsang, Bedford, Mass.

[73] Assignee: Analog Devices, Inc., Norwood, Mass.

[21] Appl. No.: 801,410

[22] Filed: May 27, 1977

[51] Int. Cl.$^2$ ............................................. H01L 29/90
[52] U.S. Cl. ......................................... 357/13; 357/89; 357/90
[58] Field of Search .............................. 357/13, 89, 90

[56] References Cited

U.S. PATENT DOCUMENTS

| 3,378,915 | 4/1968 | Zenner | 357/13 |
| 3,881,179 | 4/1975 | Howard | 357/13 |

Primary Examiner—Edward J. Wojciechowicz

Attorney, Agent, or Firm—Parmelee, Johnson, Bollinger & Bramblett

[57] ABSTRACT

An IC chip having a Zener diode with a subsurface breakdown junction to assure stable operation. The diode is formed by a triple diffusion process compatible with conventional bipolar processing. A deep $p^{++}$ diffusion first is applied, reaching through the epitaxial region to the buried $n^+$ layer; next, a shallow $p^+$ diffusion is formed over the deep $p^{++}$ diffusion and extending laterally beyond that diffusion; finally, a shallow $n^+$ diffusion is applied over the p diffusions, to form a subsurface breakdown junction therewith. The topology of the mask windows is selected to provide concentration profiles which insure that the breakdown occurs at the subsurface junction, and that other desirable diode characteristics are achieved.

5 Claims, 3 Drawing Figures

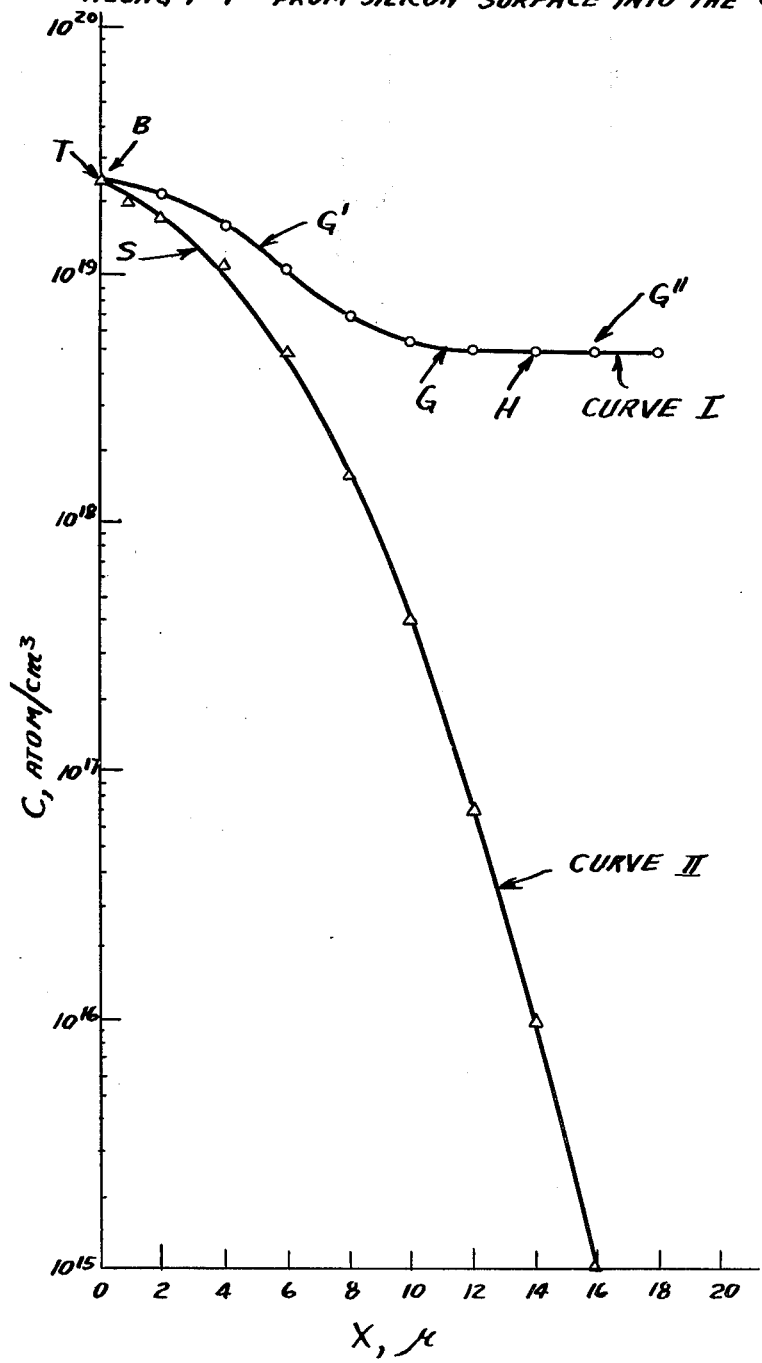

IC CHIP WITH BURIED ZENER DIODE

BACKGROUND OF THE INVENTION

1. Field of the Invention

This invention relates to integrated circuit (IC) chips of the type having diffused therein a Zener diode junction to provide a reference voltage. More particularly, this invention relates to such a Zener diode formed with a special diffusion pattern to provide significantly improved characteristics, especially enhanced stability in operation.

2. Description of the Prior Art

IC devices have for some time now included Zener diode junctions to provide a reference voltage for the associated circuitry on the chip. Typically in such arrangements the breakdown occurs at the $p^+N^+$ junction at the silicon/silicon dioxide interface of the chip. There have, however, been problems with such devices, especially drift of the breakdown voltage, e.g. as a function of time and with changes in temperature.

It has been suggested that the cause of such instability is related to the presence of the passivating/insulating layer of silicon dioxide which lies adjacent the silicon surface where breakdown takes place. It reportedly has been proposed to employ a device with subsurface breakdown based on the use of ion implantation, which theoretically could avoid problems encountered with the typical surface breakdown diodes. However, the ion implantation approach is not truly satisfactory, especially because the required manufacturing process becomes relatively complicated. Accordingly, there has been a need to provide an improved IC Zener diode whereby superior stability and other desirable characteristics can be achieved with a relatively simple manufacturing process.

SUMMARY OF THE INVENTION

In a preferred embodiment of the present invention, to be described hereinbelow in detail, an IC chip is formed with a subsurface breakdown Zener diode, i.e. a so-called "Buried Zener". This diode is formed in a procedure which is fully compatibile with conventional bipolar IC processes, so that no additional processing complications are introduced. The diode-forming procedure basically comprises three sequential diffusions, which are controlled so as to provide dopant concentrations having predetermined relationships. The result is an IC Zener diode having superior characteristics, especially with respect to stability but also including relatively low series resistance, and an appropriate value of breakdown voltage.

BRIEF DESCRIPTION OF THE DRAWINGS

FIG. 3 is a graph on log scale showing the variation in concentration of p dopant within the chip (1) along a horizontal line in the plane corresponding to line 2—2 of FIG. 1, at the silicon/silicon-dioxide interface, and (2) along a vertical line through the center of the diode structure.

DESCRIPTION OF A PREFERRED EMBODIMENT

Figure 1:
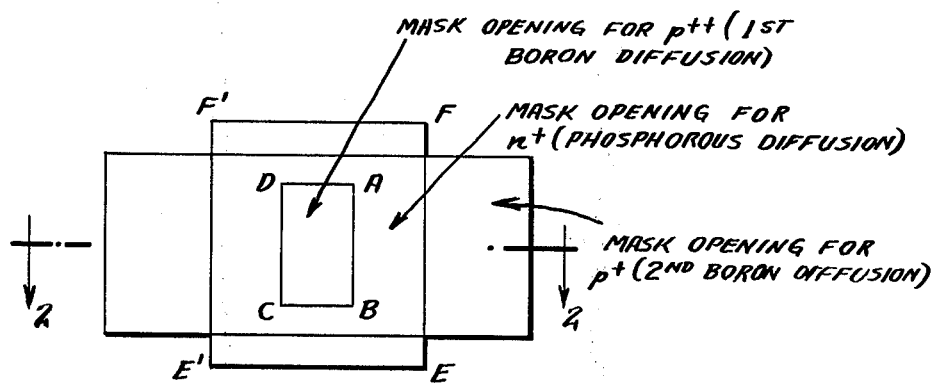
FIG. 1 shows in plan outline the configuration of the three mask windows used to control the diffusion pattern for a diode in accordance with this invention.

In the preferred embodiment of this invention, diffusions are carried out on a conventional wafer comprising a silicon substrate 10 (FIG. 2) of p-type material having an epitaxial layer 12 of n-doped silicon and the usual $n^+$ buried layer 14 at the horizontal interface. The first step is to make a deep diffusion of p-type dopant (in this case boron) into the epitaxial layer to form a highly concentrated $p^{++}$ region 16 which extends down to the $n^+$ buried layer 14. This diffusion is applied through a relatively small mask window, labelled ABCD in FIG. 1. The diffused region extends laterally a substantial distance away from the edges of the window, due to the depth of the diffusion.

This first diode diffusion step is carried out simultaneously with the isolation diffusion step for the IC chip, wherein deep isolation bands are formed between the transistors of the associated circuitry to be placed on the chip. Thus no additional processing is required for this first diode diffusion step.

Figure 2:
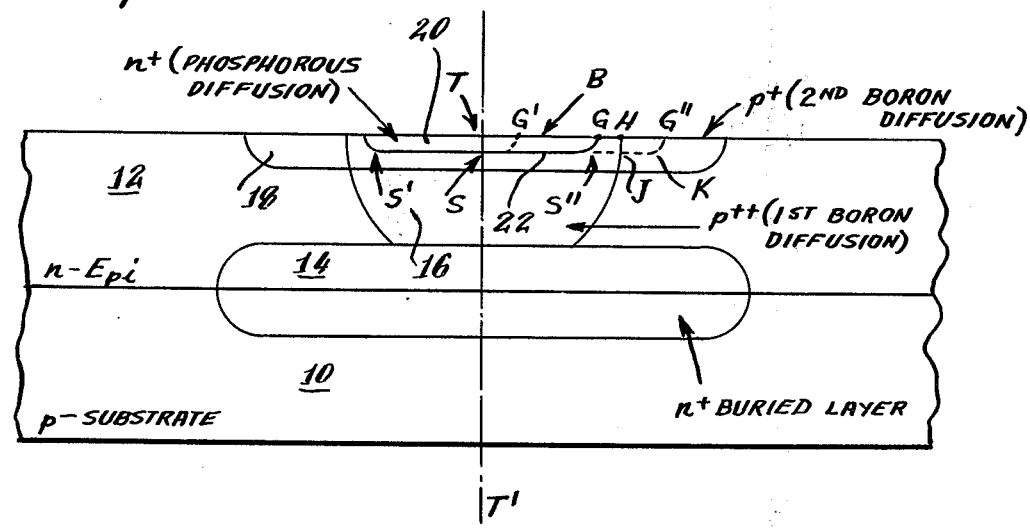
FIG. 2 is a cross-section view of the IC chip, taken along the vertical plane corresponding to line 2—2 of FIG. 1.

The next step is to make a relatively short-duration diffusion of p-type material (boron) to form a comparatively shallow $p^+$ region 18, over the deep $p^{++}$ region 16 but laterally wider, as seen in the vertical section plane of FIG. 2. The window for this diffusion is relatively elongate in the horizontal direction (referring to FIG. 1) to provide for lateral extension substantially beyond the side edge of the preceding deep diffusion 16. This diffusion is carried out simultaneously with the diffusion for the transistor base regions of the associated circuitry on the chip, and thus does not require any additional processing.

Finally, n-type dopant (e.g. phosphorous) is diffused centrally over the preceding two diffusions, to form a shallow $n^+$ region 20 located wholly within the side edges of the first deep $p^{++}$ diffusion 16, in the vertical plane of FIG. 2, and having less depth than the second diffused region 18. The mask window for this third diffusion has a nearly square configuration EFF'E', whereas the window for the second diffusion is an elongate rectangle. The third diffusion is carried out simultaneously with the diffusion for forming the emitters of the transistors of the associated circuitry on the chip, and thus requires no additional processing.

The breakdown junction of the diode formed as described above is the horizontal interface 22 between the $n^+$ region 20 and the $p^+$, $p^{++}$ regions 16, 18. Electrical connection to the n terminal of this junction is effected through a contact (not shown) formed on the surface of the $n^+$ region 20. Electrical connection to the p terminal of the junction is effected through a contact (not shown) formed on the surface of the $p^+$ region 18, where it extends out laterally beyond the $n^+$ region 20. Thus, the electrical connection for the p terminal of the diode passes through the laterally-extended portion of the $p^+$ region 18 which reaches to the silicon surface, and through the subsurface $p^+$ channel JK which lies between the $n^+$ region 20 and the epitaxial layer 12.

It will be seen from FIG. 2 that the side edges of the shallow $p^+$ diffusion lie beyond the corresponding side edges of the deep $p^{++}$ diffusion 16, in the vertical plane of the cross-sectional view. The side edges of the deep $p^{++}$ diffusion are, in turn, beyond the side edges of the $n^+$ diffusion 20, in that vertical plane. (In the vertical plane at right angles to the cross-section view, the $n^+$ diffusion extends beyond the p diffusions so that there is not a pn surface junction in that plane.)

To provide the best results the concentration profile of p dopant in the diode should be controlled to provide certain interrelationships. In particular, the concentration of p dopant (boron) in the central region S forming the horizontal junction 22, i.e. the region lying within the confines of S' S", is controlled to be larger than the concentration of boron in the surface region G between the inner n+ region 20 and the p++, p+ regions 16, 18 adjacent the n+ region. This relationship is illustrated in the graph of FIG. 3, where the concentration of boron at G is shown at a corresponding location on curve I and the concentration of boron at S is shown at a corresponding location on curve II.

This desired relationship can be achieved by preselecting the dimensions and locations of the mask windows for the diffusions, especially by fixing the location EFF'E' in relation to that of ABCD. Placement of the side edges of EFF'E' at positions other than optimum will result in deterioration of the desired diode characteristics. For example, if the edge EF is too far to the left, so that the n+ diffusion intercepts the boron at a point where the boron concentration is higher than at S (as illustrated in interrupted outline by the position of a hypothetical resulting diffusion side edge G'), the device will behave more as a surface breakdown diode, with its attendant deficiencies as discussed above. Alternatively, if the edge EF is too far to the right, so that the n+ diffusion intercepts the boron region where the p dopant concentration is essentially the surface concentration of the shallow p+ diffusion (a position illustrated in interrupted outline by hypothetical diffusion side edge G"), the electrical connection channel JK to the subsurface junction 22 will be relatively long and will introduce too great a resistance in series with the diode.

By utilizing the optimum relationships described above, it becomes possible to provide a very stable IC Zener diode having a series resistance less than about 300 ohms, a desirable breakdown voltage of about 6–7 volts, and an advantageous voltage temperature coefficient of about 2.5 mV/° C.

Although a specific preferred embodiment of the invention has been described herein in detail, it is desired to emphasize that this is for the purpose of illustrating the principles of the invention, and should not necessarily be construed as limiting of the invention since it is apparent that those skilled in this art can make many modified arrangements of the invention without departing from the true scope thereof.

I claim:

1. An IC chip comprising a planar element having a Zener diode junction formed of the following overlying set of diffusions:
   (a) a deep p diffusion;
   (b) a shallow p diffusion over said deep diffusion and having at least one side edge which is laterally beyond the corresponding side edge of said deep diffusion in one plane perpendicular to the surface of said element; and
   (c) an n diffusion over said shallow p diffusion, said n diffusion being shallower than said shallow p diffusion and positioned wholly within the lateral limits of said deep p diffusion in said one plane.

2. An IC chip as in claim 1, wherein the concentration of p dopant in the central region of the interface between said n diffusion and the p diffusion therebeneath is greater than the concentration of p dopant at the surface junction between the n diffusion and the p diffusion.

3. An IC chip as in claim 1, wherein said shallow p diffusion extends laterally substantially beyond said deep p diffusion on both sides thereof in said perpendicular plane.

4. An IC chip as in claim 3, wherein said shallow n diffusion, in a plane which is perpendicular both to the surface and said element and to said first-named plane, extends beyond the adjacent outer side edges of both of said p diffusions.

5. An IC chip presenting a buried Zener-diode junction comprising:
   a first layer of n dopant in the surface of the silicon layer of the chip;
   a second layer of p dopant having a first portion beneath said first layer and providing in its central regions a subsurface junction with said first layer;
   said second layer having a second portion extending out laterally beyond said first layer up to the silicon surface of said chip alongside of said n layer and providing for electrical connection from the silicon surface, through said p layer and beneath said n layer, to said subsurface junction;
   the concentration of p dopant in the region of said p layer which is centrally disposed beneath said n layer being substantially higher than the concentration of p dopant in the surface regions of said p layer which adjoin said n layer.

* * * * *